(12) United States Patent
Peek et al.

(10) Patent No.: US 6,448,592 B1
(45) Date of Patent: *Sep. 10, 2002

(54) CHARGE COUPLED DEVICE, AND METHOD OF MANUFACTURING SUCH A DEVICE

(75) Inventors: Hermanus L. Peek; Daniel W. E. Verbugt, both of Eindhoven (NL)

(73) Assignee: Koninklijke Philips Electronics N.V., New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/924,863

(22) Filed: Sep. 5, 1997

(30) Foreign Application Priority Data

Sep. 10, 1996 (EP) .............................................. 96202523

(51) Int. Cl.[7] ....................... H01L 27/148; H01L 21/339
(52) U.S. Cl. ........................ 257/215; 257/218; 438/144
(58) Field of Search ............................... 438/60, 75, 76, 438/77, 78, 79, 144, 145, 146, 147, 148; 257/215–251, 233

(56) References Cited

U.S. PATENT DOCUMENTS

| | | | | |
|---|---|---|---|---|
| 3,909,925 A | * | 10/1975 | Forbes et al. ................ | 438/587 |
| 4,077,112 A | | 3/1978 | Theunissen et al. | |
| 4,686,759 A | * | 8/1987 | Pals et al. .................... | 438/587 |
| 4,754,311 A | * | 6/1988 | Davids et al. ............... | 257/249 |
| 5,238,863 A | * | 8/1993 | Fukusho et al. ............. | 438/591 |
| 5,338,948 A | * | 8/1994 | Sims ........................... | 257/249 |
| 5,434,097 A | * | 7/1995 | Shin et al. .................... | 438/60 |
| 5,449,931 A | * | 9/1995 | Peek et al. ................... | 257/231 |
| 5,541,133 A | * | 7/1996 | Peek ........................... | 438/144 |

FOREIGN PATENT DOCUMENTS

| | | | | |
|---|---|---|---|---|
| JP | 03030439 A | * | 2/1991 | ......... H01L/21/339 |
| JP | 07202160 A | * | 8/1995 | ......... H01L/27/148 |

* cited by examiner

*Primary Examiner*—Trung Dang
*Assistant Examiner*—Brook Kebede
(74) *Attorney, Agent, or Firm*—Steven R. Biren

(57) ABSTRACT

It is known in charge coupled devices to use a dual layer of silicon oxide and silicon nitride as the gate dielectric. Since silicon nitride is practically impermeable to hydrogen, the nitride layer is usually provided with openings through which hydrogen can penetrate up to the surface of the silicon body during the annealing step carried out for passivating the surface. The openings in the nitride layer are provided by a known method, with gates in a first poly layer serving as a mask, in that the nitride is removed from between these gates and an oxidation step is subsequently carried out. According to the invention, the openings in the nitride layer are formed by means of a separate mask (20), such that the edges of the openings (9) in the nitride layer (8) lie at some distance from the edges of the gates. It was found that the dark current can be substantially reduced by this method, and that in addition quantities such as the fixed pattern noise and the number of white spots can be advantageously reduced.

10 Claims, 5 Drawing Sheets

CHARGE COUPLED DEVICE, AND METHOD OF MANUFACTURING SUCH A DEVICE

BACKGROUND OF THE INVENTION

The invention relates to a charge coupled device with a semiconductor body which is provided at a surface with a system of silicon electrodes to which voltages can be applied for controlling the storage and transport of electric charges in the semiconductor body, which electrodes are separated from the surface at least locally by a dielectric layer comprising a dual layer of silicon oxide and silicon nitride, the latter being locally provided with openings. The invention also relates to a method of manufacturing such a charge coupled device.

A charge coupled device and a method of the kind as described above are known inter alia from U.S. Pat. No. 4,077,112. A device is described therein where the electrodes are formed in two or more layers of polycrystalline silicon (referred to as poly hereinafter). In a first step, the (active portion of the) surface of the semiconductor body is covered with gate oxide on which subsequently a layer of silicon nitride is deposited. The first poly layer is provided thereon, and a number of electrodes are formed from the poly layer by known photolithographic means. Said electrodes are covered with a layer of silicon oxide by thermal oxidation, this layer forming an electrical insulation layer against any subsequent poly layer. During the oxidation step, the portion of the surface not covered with poly is masked against oxidation by the silicon nitride layer, whereby it is prevented that the gate oxide becomes thicker locally than is desired. After the oxidation, openings are formed in the silicon nitride layer through etching in a self-aligned manner, the poly electrodes formed with the oxide layer present thereon acting as an etching mask during this. As is described in the Patent, these openings in the nitride layer are necessary for efficiently passivating the surface in a later stage through annealing in hydrogen. This is because the density of silicon nitride is usually so great that, without openings in the silicon nitride layer, the hydrogen would be incapable of reaching the surface of the semiconductor body everywhere. A light oxidation step is subsequently carried out which renders the thickness of the uncovered gate oxide somewhat greater. Then a second conductive layer is deposited from which electrodes are formed next to the electrodes already present and electrically insulated therefrom by the oxide layer on the electrodes which were provided first.

As was noted above, the surface of the semiconductor body can be effectively passivated through heating in an environment containing hydrogen, during which hydrogen can spread through the openings in the nitride over the surface through diffusion. This step considerably reduces the concentration of surface states, and thus the leakage current. A reduction in the leakage current is of particular, though not exclusive importance in charge coupled imaging devices because local leakage currents may give rise to a greater spread in the dark current, and thus to an uneven picture on a display device.

SUMMARY OF THE INVENTION

The present invention has for its object inter alia to reduce the leakage current still further.

According to the invention, a charge coupled device of the kind described in the opening paragraph is for this purpose characterized in that the openings in the silicon nitride layer are bounded by edges which, seen transverse to the surface, lie at a distance from the edges of adjoining electrodes. The invention is based inter alia on the recognition that an oxide with a LOCOS-type structure is formed in the openings in the silicon nitride layer in the known device. The transition from this LOCOS oxide to the original, thinner gate oxide via a so-called bird's beak, the location of which is defined by the edges of the openings in the silicon nitride layer, coincides with the edges of the poly electrodes which are present. The invention is furthermore based on the recognition that the presence of the poly electrodes above the bird's beak may induce additional mechanical stresses in the subjacent active region, which stresses cause an increase in the leakage current or, in the case of an imaging device, the dark current. In a charge coupled device according to the invention, the edges of the poly electrodes do not coincide with the edges of the openings in the nitride layer, so that major leakage currents are avoided.

The invention offers particular advantages when the surface area of the charge coupled device is very large, because in such cases the openings in the silicon nitride layer are important for the lateral spread of the hydrogen over the entire device. A major embodiment according to the invention is characterized in that the device comprises a number of parallel charge transport channels which form a matrix in which charge packets can be stored in a bidimensional pattern and can be transported in parallel to read-out means.

The device may be, for example, a memory of the SPS type here where (digital) information is put in in series, is transported in parallel through the matrix, and is read out in series again.

An embodiment for which a low and uniform leakage current is particularly important, because non-uniformities in the leakage current will become visible again upon the display of the image, is characterized in that the device forms a charge coupled imaging device.

A preferred embodiment of a charge coupled imaging device according to the invention is characterized in that the system of electrodes forms openings, referred to as windows, which transmit electromagnetic radiation, within which the surface is not covered by material of the electrodes, and which are situated between mutually adjoining charge transport channels. Since the electromagnetic radiation can reach the photosensitive portion of the device through said windows without passing through the poly material of the In electrodes, the sensitivity of the imaging device will be high. A further embodiment is characterized in that the openings in the silicon nitride layer are formed at the areas of said windows, the edges of the openings lying at a distance from the edges of the windows. Preferably, the distance between the edges of the openings in the silicon nitride layer and the edges of the windows is chosen to be equal to or greater than 1.0 $\mu$m so as to minimize the influence of the edges of the electrodes on the bird's beak and thus to minimize the leakage current. Since there will always be a certain increase in the leakage current at the areas of the openings in the silicon nitride layer, it is advantageous to drain off this leakage current as much as possible through channel bounding zones. Accordingly, a further embodiment is characterized in that mutually adjoining charge transport channels in the semiconductor body are separated from one another substantially only by a channel bounding region, the openings in the silicon nitride layer being situated above the channel bounding regions.

A further embodiment of a charge coupled imaging device according to the invention, in which the openings in the silicon nitride layer can be provided independently of the positions of radiation-transmitting windows in poly layers, is characterized in that at least a number of the openings in the silicon nitride layer is provided between the surface of the semiconductor body and electrodes which extend over the openings. If the electrodes in this embodiment are provided with radiation-transmitting windows, the silicon nitride can also be removed at the areas of these windows through the use of a mask. A preferred embodiment, which has the advantage that no oxidation is necessary at the areas of these windows, is characterized in that the surface is covered by portions of the silicon nitride layer at the areas of the radiation-transmitting windows.

Various designs are possible when the electrodes are manufactured from two or more poly layers. Thus the openings may be formed in the silicon nitride layer before the deposition of the first poly layer or after the deposition of the first poly layer and before deposition of a second or third poly layer. An important embodiment of the invention is characterized in that the electrodes are formed from two or more layers of silicon, electrodes formed from a first silicon layer being separated from the surface by a first layer of silicon nitride provided with said openings, and electrodes formed from a second layer of silicon being insulated from the electrodes of the first layer of silicon by a second silicon nitride layer which is also provided with openings.

A method according to the invention for manufacturing a device as described above is characterized in that the openings in the silicon nitride layer are defined by means of an etching mask which was formed by way of photolithography and is provided with openings through which the silicon nitride layer is subjected to an etching treatment.

BRIEF DESCRIPTION OF THE DRAWINGS

These and other aspects of the invention will be explained in detail with reference to several embodiments. In the drawing.

DESCRIPTION OF THE PREFERRED EMBODIMENTS

Figure 1:
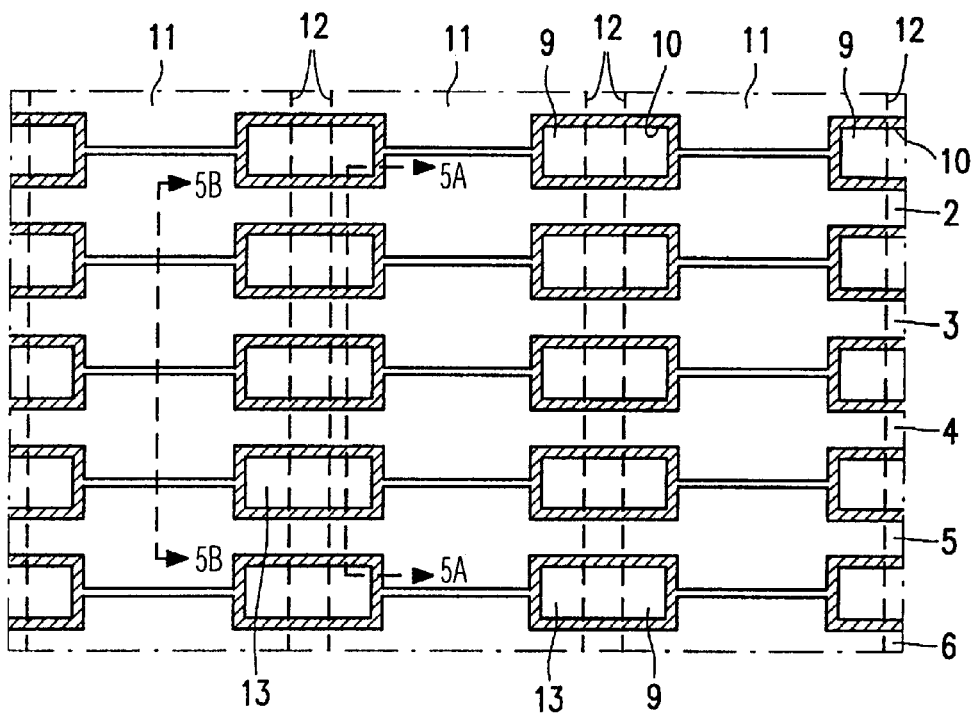
FIG. 1 is a plan view of a charge coupled device according to the invention.
Figure 5A:
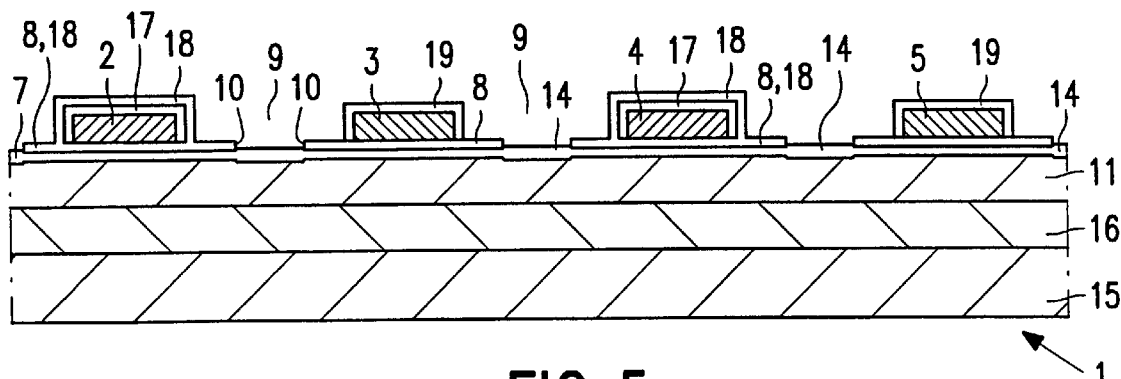
Figure 5B:
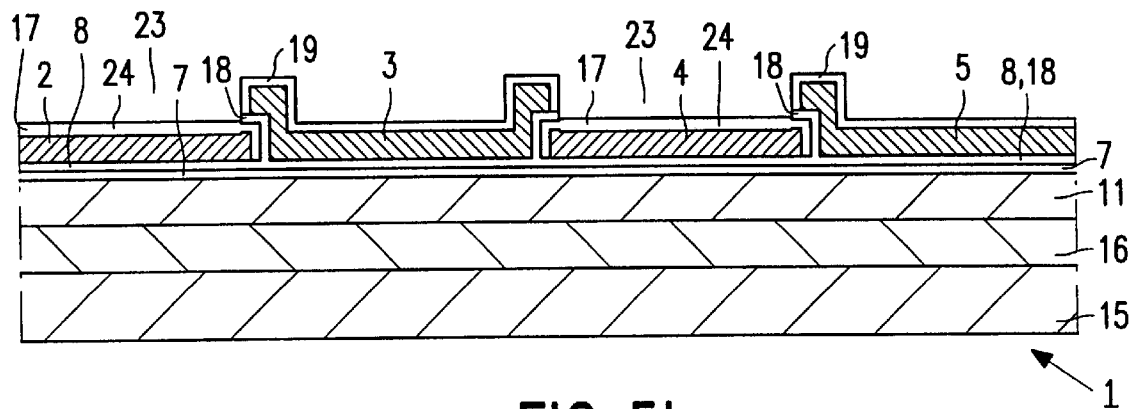

FIG. 1 is a plan view of part of a charge coupled device according to the invention. FIGS. 5a and 5b show cross-sections through this device taken on the lines 5A—5A and B—B, respectively. The device comprises a semiconductor body 1 of silicon which is provided at its surface with a system of electrodes 2–6 manufactured from doped silicon which usually has the polycrystalline form, and is accordingly referred to as poly hereinafter. As is known, clock voltages can be applied to the electrodes 2–6 by voltage means not shown in the drawing, such that information in the form of packets of electric charge can be generated and transported to read-out means (also not shown) in a controlled manner. The electrodes are insulated from the silicon of the semiconductor body by means of a dielectric layer which comprises a dual layer at least locally, formed by a layer 7 of silicon oxide and a layer 8 of silicon nitride. As will become apparent below, the nitride prevents oxidation of the surface of the semiconductor body 1 during oxidation of the poly electrodes. The silicon nitride is locally provided with openings 9 because hydrogen is practically incapable of diffusing through the silicon nitride. During production, hydrogen can diffuse through these openings along the surface in a heating step and reduce the number of surface states, and thus the leakage current in the device, for example by binding itself to dangling bonds of the silicon crystal. Reference may be made to the cited U.S. Pat. No. 4,077,112 in this connection.

According to the invention, the openings are provided such that the edges 10 of the openings 9, seen transverse to the surface of the semiconductor body, lie at a distance from the edges of adjoining electrodes 2–6. Since the openings in the nitride layer 8 serve to enable hydrogen diffusion, the invention is particularly, though not exclusively important for devices having a large surface area with a number of charge transport channels 11 (three of which are shown in FIG. 1, but the actual number is usually much higher), which form a matrix in which charge packets can be stored in a bidimensional pattern and can be transported in parallel to an output which is not shown in the drawing. Such a matrix may be a memory, for example of the SPS type. In the present embodiment, the matrix forms part of a charge coupled imaging device. The device may be of the interline type, in which the photosensitive elements are formed by photodiodes arranged in rows and columns, while charge transport channels 11 are formed between the columns for the charge transport. In the present embodiment, the photosensitive elements are formed by the charge coupled device itself, and the generation of charge caused by the absorption of light takes place in the charge transport channels 11 which are separated from one another exclusively by the channel bounding zones 12. To increase the sensitivity, the system of electrodes 2–6 is provided with radiation-transmitting windows 13 within which the surface of the semiconductor body is not covered with poly, so that light can reach the semiconductor body 1 directly at the areas of these windows without being partly absorbed by poly. The openings 9 in the silicon nitride layer 8 are situated concentrically in the windows 13 such that the edges of the openings in the silicon nitride lie at some distance away from the edges of the radiation-transmitting windows 13. In FIG. 1, the portions of the silicon nitride layer which project beyond the poly are marked with crosses for clarity. The effect of this measure is shown in FIG. 5a. After the annealing step in hydrogen, an oxidation step is carried out whereby LOCOS-type thickenings are formed in the oxide layer 7 at the areas of the openings 9 in the nitride layer. It was found in practice that the leakage current in the device can be reduced considerably further through a lateral separation of the electrodes 2–6 from the LOCOS 14, compared with a known device in which the openings 9 in the nitride layer, and thus also the LOCOS 14, are aligned with the electrodes. A possible explanation could be that stresses are induced in the silicon crystal lattice, generating additional leakage currents, especially at the edge of the LOCOS (bird's beak). If the openings in the nitride layer coincide with the edges of the electrodes, the bird's beak of the LOCOS will also coincide with the edges of the electrodes, which could give rise to additional mechanical stresses in the lattice and thus to additional leakage currents. Making the openings in the nitride layer smaller than the windows 13 in the electrodes, according to the present invention, achieves that the bird's beak does not lie below the poly, so that mechanical stresses in the crystal lattice and thus the generation of leakage currents in the charge coupled device are reduced. The distance between the nitride edges 10 and the edges of the window 13 is at least approximately 1 μm for obtaining a satisfactory suppression of the leakage current.

Figure 2A:
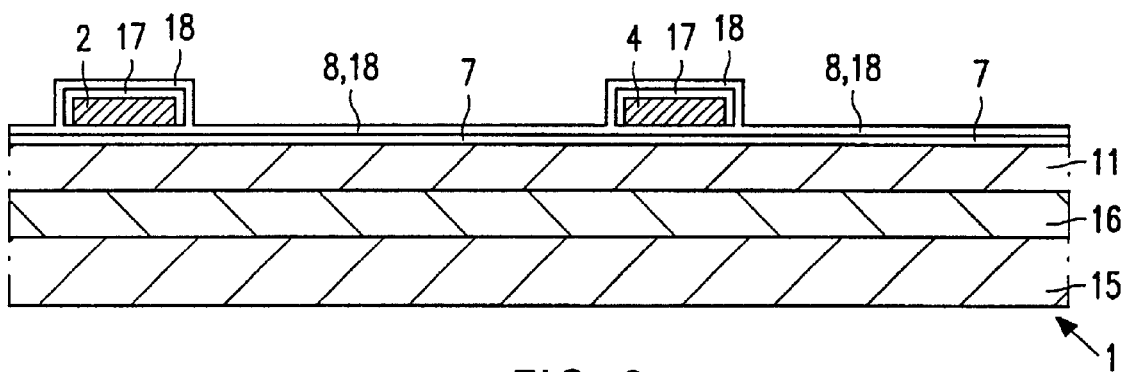
FIGS. 2 to 5 show cross-sections through this device taken on the lines 5A—5A and 5B—5B during various stages in the manufacture of the device.
Figure 2B:
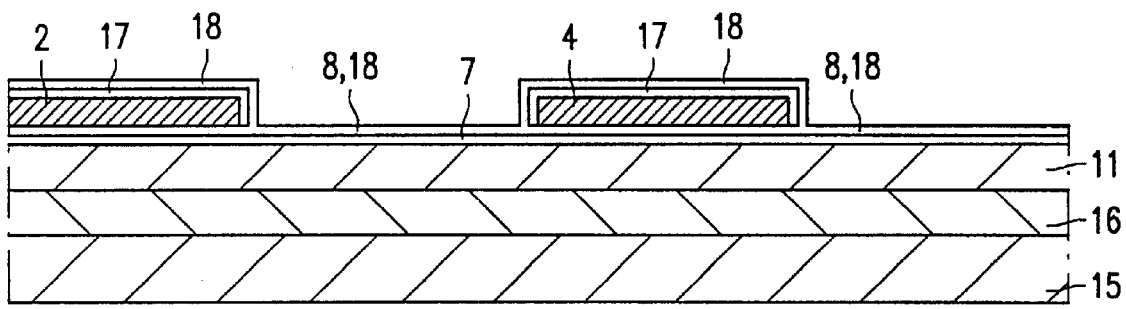

A few steps in the manufacture of the device will now be described with reference to FIGS. 2–5, each Figure comprising a part a which is a cross-section taken on the line 5A—5A and a part b which is a cross-section taken on the line 5B—5B in FIG. 1. The device which is described here by way of example is of a type known per se, i.e. an N-channel buried channel device with vertical antiblooming. The device is for this purpose provided with a semiconductor body 1 of known construction, with an N-type silicon substrate 15 which forms a draining-off region for excess electrons. The substrate 15 is provided at its surface with one (or several) P-type well(s) 16 in which the N-type CCD channels 11 are formed, mutually separated by the P-type channel bounding zone 12. The depth and doping concentrations of the various N-type and P-type doped regions are chosen such that a potential barrier is formed in the P-type zone 16 below the channel 11 (cf., for example, FIG. 2a), which barrier has a level at which, once a certain pixel has been completely filled upon local overexposure, excess electrons will flow over this barrier to the substrate so as to be drained off there without filling adjoining pixels. The surface of the semiconductor body 1 is covered with a dielectric layer which is a dual layer here comprising a layer 7 of silicon oxide of a thickness of, for example, 62 nm, and a layer 8 of silicon nitride of a thickness of approximately 75 nm. A first poly layer (polycrystalline silicon) is deposited thereon, which is doped and from which the electrodes 2, 4, 6, etc. are formed by photolithographic means. These electrodes are comparatively narrow at the areas of the windows 13 to be formed (FIG. 2a) and comparatively wide between these windows (FIG. 2b). The electrodes 2, 4, 6 are subsequently subjected to an oxidation step whereby the upper surfaces and the lateral edges of the electrodes are covered with a layer 17 of silicon oxide to a thickness of approximately 200 nm. During the oxidation step, the thickness of the oxide layer 7 does not or at least substantially not increase owing to the presence of the nitride layer 8. Then a layer 18 of silicon nitride, for example 40 nm thick, is provided over the entire assembly. This nitride layer forms a coherent layer with the nitride layer 8 already present between the electrodes 2, 4, 6, etc., but on the electrodes 2, 4, 6 etc. the nitride layer 18 forms a separate layer. FIG. 2 shows the device in this stage.

Figure 3A:
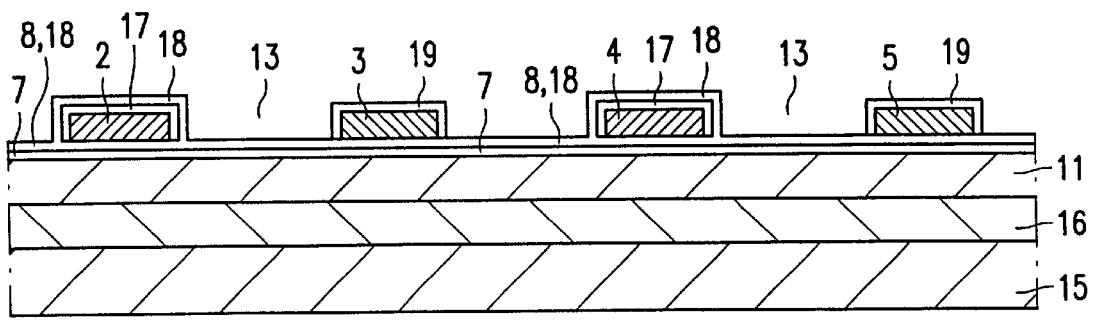
Figure 3B:
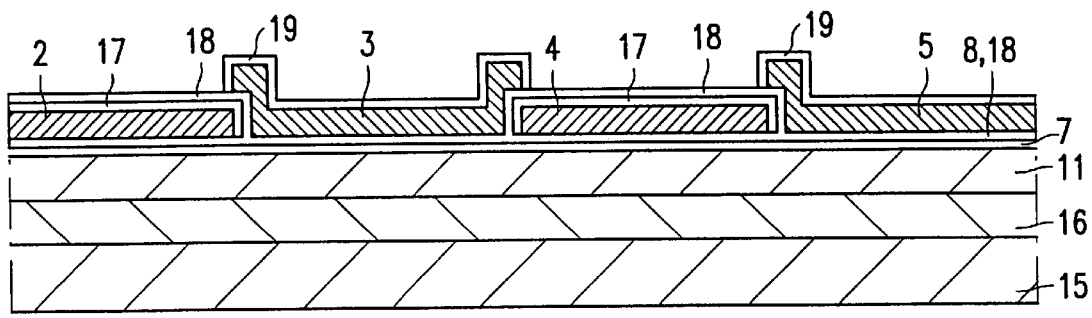

In a next stage, a second, doped poly layer is provided, and the electrodes 3, 5, etc. are provided in this poly layer between the electrodes 2, 4, etc. alreay present by photolithographic means (FIG. 3). As is shown in the Figure, the electrodes are narrow at the areas of the cross-section a—a, so that light-transmitting windows entirely free from poly are formed here; the electrodes are wide at the areas of the cross-section b—b, and thus cover the entire space. After the definition of the poly electrodes 3, 5, etc., another oxidation step is carried out whereby the electrodes 3, 5 are covered with an oxide layer 19 with a thickness of approximately 200 nm. This stage of the process is shown in FIG. 3. The surface of the semiconductor body 1 and of the electrodes 2, 4, 6 is masked against oxidation by the combined nitride layers 8, 18 during this oxidation.

Figure 4A:
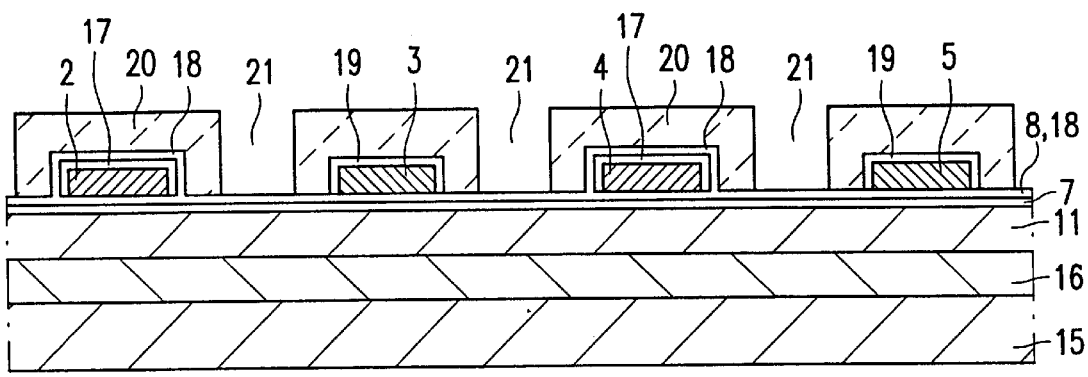
Figure 4B:
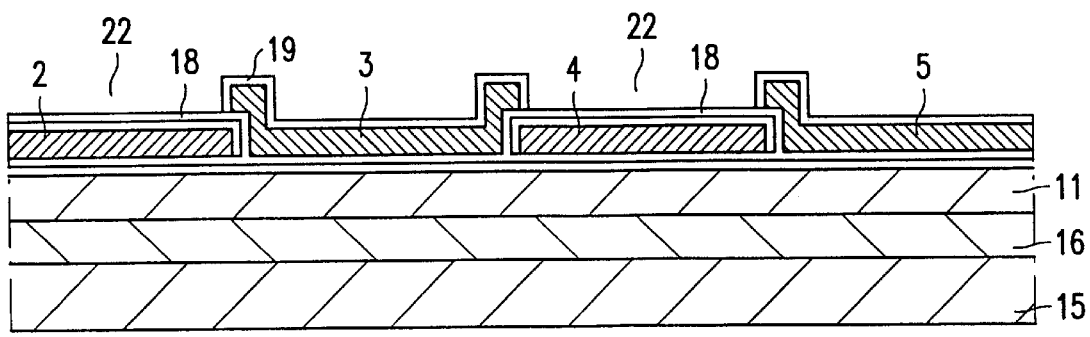

In a next stage shown in FIG. 4, an etching mask 20 is provided in the form of a suitable photoresist layer. The mask has openings 21 which define the openings 9 to be formed in the nitride layer. The mask 20 overlaps the electrodes 2–6 on either side, as is visible in FIG. 4a, so that the openings 21 will not coincide with the edges of the electrodes. The nitride in poly I may be retained over the electrodes 2, 4, etc. above the CCD channels, if so desired. Preferably, however, this nitride is removed as much as possible for improving the sensitivity. This is why the mask 20 in the present example is provided with openings 22 (FIG. 4b) above the electrodes 2, 4, 6 and extending over substantially the entire width of the channels 11, while extending next to the windows 13 at most over a distance which is a function of alignment tolerances. Then the nitride layer 8, 18 is provided with the openings 9 within the light-transmitting windows 13, see FIG. 5, by plasma etching in, for example, a mixture of $Cl_2$ and HBr. At the same time, openings 23 are also formed in the nitride layer 18 on the electrodes 2, 4, 6. The photoresist of the mask 20 may be removed by a usual method after etching of the nitride.

The device is once more subjected to an oxidation treatment after this, inter alia for adjusting the dielectric thickness of the layer again. Certain defects introduced through etching can also be removed by means of such an oxidation step. This oxidation causes the oxide layer 7 in the openings 9 in the nitride layer 8, 18 to grow, whereby the LOCOS-type thickenings 14 are formed at the areas of these openings, see FIG. 5a. The oxide layer 19 on the electrodes 2, 4, 6 at the areas of the openings 23 in the nitride layer 18 also becomes thicker during this, so that here the LOCOS-type thickenings 24 are formed, see FIG. 5b. The device may subsequently be subjected to the usual further process steps, in particular a heating step in an environment containing hydrogen at a temperature of approximately 450° C. for passivating the surface. The hydrogen molecules can diffuse through the openings 9 and 23 in the nitride layer towards and along the surface during this and attach themselves to the dangling bonds of the silicon crystal there.

It was found in measurements that the placement of the openings 9 at a distance from the electrodes can provide a reduction in the dark current by a factor of 4 to 10. In addition, a considerable reduction was obtained in the FPN (fixed pattern noise), i.e. by a factor of 2 to 4, and in the number of defects in the form of white dots.

It is noted that the device described here may form part of an imaging device of the frame transfer type. Such a device has, as is known, a memory matrix besides the photosensitive matrix described above. When a picture has been absorbed during an integration period and converted into a bidimensional pattern of charge packets, this pattern can be quickly transported into the memory matrix. The information can be read out line by line in the memory section while a new picture is captured in the imaging section. The memory matrix may advantageously be provided with openings in the nitride layer as well, in the same manner as the imaging section. If so desired, however, these openings may be omitted in the memory section. This may result in a higher leakage current in the memory section. This higher leakage current (as long as it does not become too high, of course) need not necessarily be a major disadvantage because this component substantially has the same value for the pixels within a column, because the pixels are continuously displaced, which renders it possible to compensate for this component by electronic means. Such a compensation is less easy for the leakage current in the imaging section because the leakage current is a different one for the different pixels in a column in principle.

Figure 6:
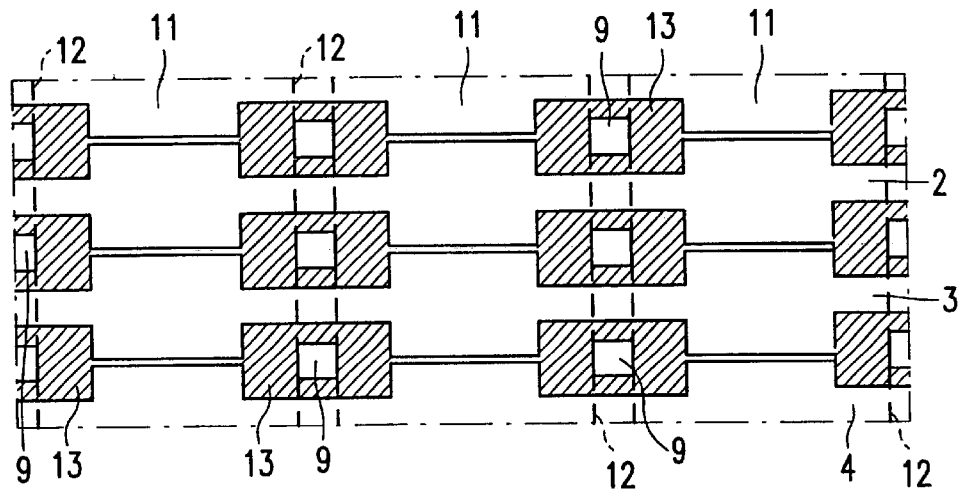
FIG. 6 is a plan view of a second embodiment of a device according to the invention.

FIG. 6 is a plan view of a modification of the device of FIG. 1. The openings 9 in the nitride layer in this modification are dimensioned relative to the channel boundary zones 12 such that the openings 9 lie entirely above the channel bounding zones 12. The region within the semiconductor body where lattice stresses may be induced owing to the LOCOS edge is entirely or at least substantially entirely limited to the zones 12 in this embodiment. Since these zones are not in the depleted state during operation of the device, these lattice stresses do not or at least substantially not lead to an increase in the leakage current.

Figure 7:
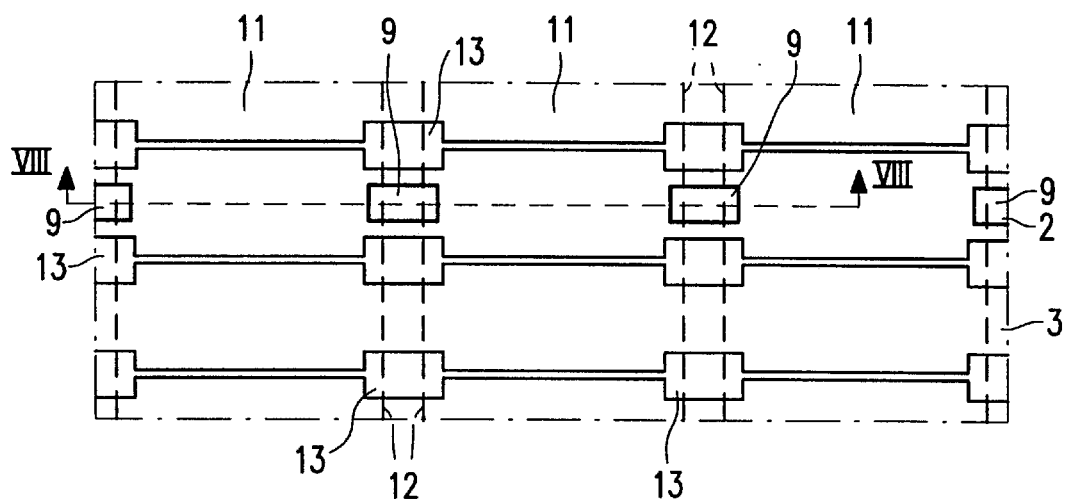
FIG. 7 is a plan view of a third embodiment of a charge coupled device according to the invention.
Figure 8:
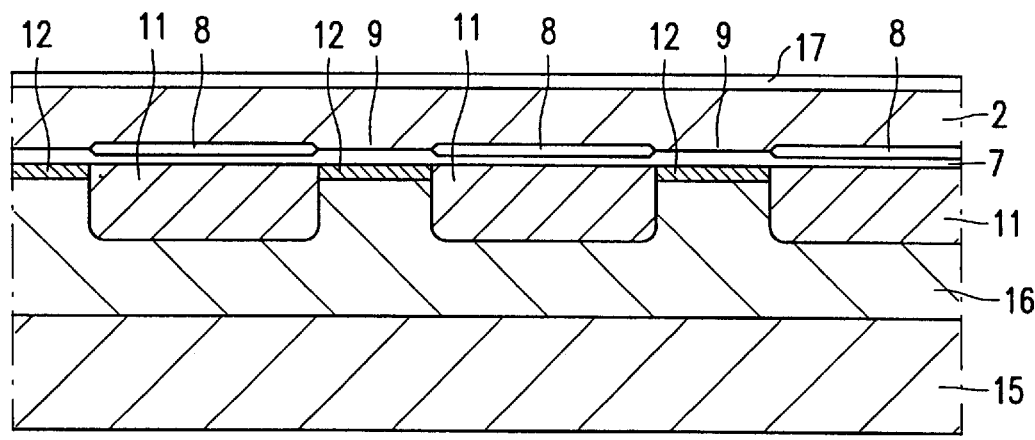
FIG. 8 is a cross-section of this device taken on the line VIII—VIII in FIG. 7.

FIGS. 7 and 8 show a further embodiment, in plan view and in cross-section, respectively, which may be used to advantage when the light-transmitting windows 13 in the system of electrodes are so small that no openings in the nitride layer can be provided therein. In that case the openings 9 may be formed, for example, below the electrodes 2, 4, etc. in the first poly layer. These openings are provided before the first poly layer is deposited, for example again at the areas of the P-type channel bounding zones 12. The dimensions and the localization of the openings 9 relative to the poly electrodes are such again that the edges of the openings 9 are at a distance of 1 $\mu$m or more from the poly edges. Then a light oxidation step is performed by which the oxide of the layer 7 is made somewhat thicker locally. Poly I is subsequently provided, and the poly electrodes 2, 4, etc. are formed therefrom in a usual manner. These gates are provided with the oxide layer 17 through thermal oxidation. Then the poly II is deposited, from which the gates 3, 5, etc. are formed. Hydrogen can reach the surface of the semiconductor body through the poly gates and the openings 9 in the nitride layer during annealing in this embodiment. The light-transmitting windows 13 in this embodiment may remain covered with nitride, which has the advantage that it is prevented that impurities reach the surface through these windows.

Figure 9:
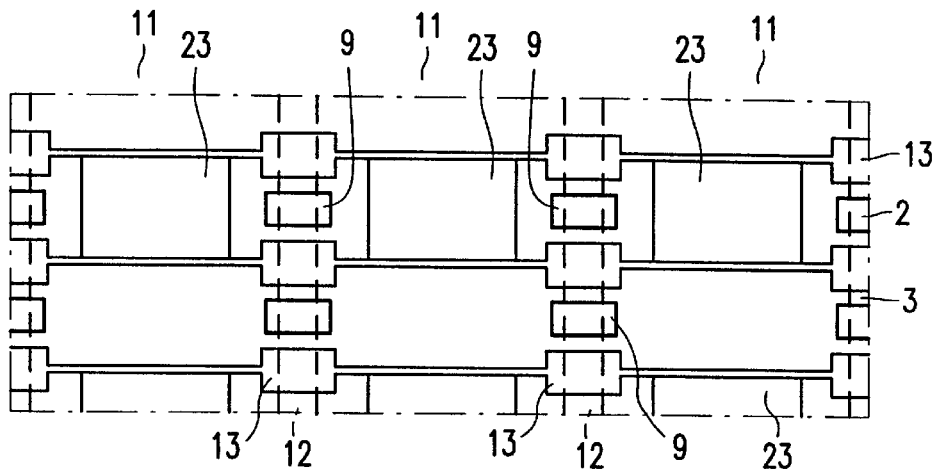
FIG. 9 is a plan view of a further embodiment of a charge coupled device according to the invention.

FIG. 9 shows a modification of the embodiment of FIGS. 7 and 8 in plan view, where a second nitride layer is deposited, similar to the nitride layer 18 in the first embodiment, after the poly electrodes 2, 4 have been defined in the first poly layer. In this case openings 23 are also provided in the second nitride layer above the electrodes 2, 4 besides the openings 9 in the first nitride layer below the first poly layer. During the annealing step, hydrogen can reach the surface of the semiconductor body through these openings 23, and the subjacent poly and the openings 9 in the first nitride layer. The opening 23 shown in FIG. 9 is defined in a usual manner by means of a mask. In a modification of this method, a maskless etching step may alternatively be carried out for obtaining the openings 23 because there are two nitride layers present in the windows 13. Etching is continued until the second nitride layer has been completely removed in those locations where it was not covered with poly. No nitride is then present any more above the poly I, whereas the first nitride layer is still present (wholly or in part) in the windows 13.

Figure 10:
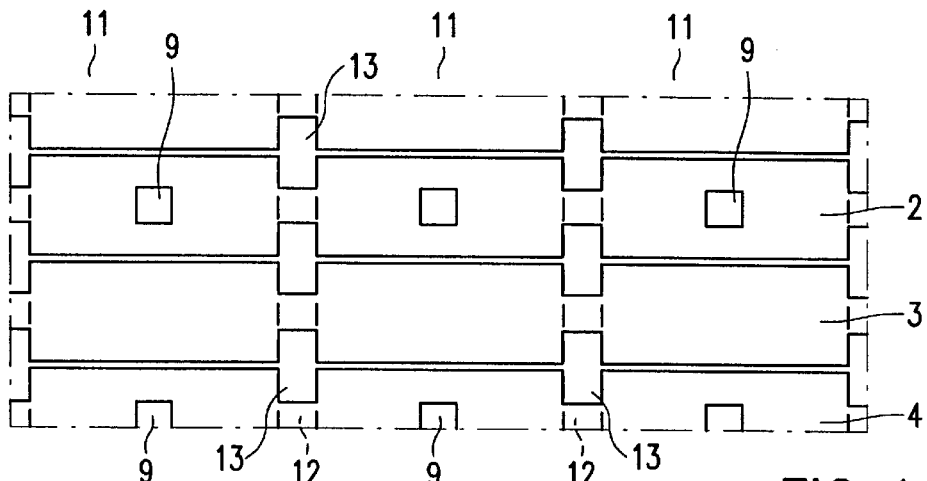
FIG. 10 is a plan view of yet another embodiment of a charge coupled device according to the invention.

The channel bounding regions 12 and the light-transmitting windows 13 may be so small that it is not very well possible with the present photolithographic techniques to provide the openings 9 in the nitride layer below the first poly layer above the channel bounding regions 12 and/or in the windows 13. In that case the openings 9 in the (first) nitride layer may alternatively be provided above the active region, i.e. above the charge transport channels 11, as is depicted in FIG. 10. This drawing only shows openings 9 situated below the first poly layer. If a second nitride layer covering the electrodes 2, 4 etc. is provided after the definition of the electrodes in the first poly layer and before the deposition of the second poly layer, openings may be provided in this nitride layer above the electrodes 2, 4, similar to the openings 23 in the preceding embodiment.

Figure 11:
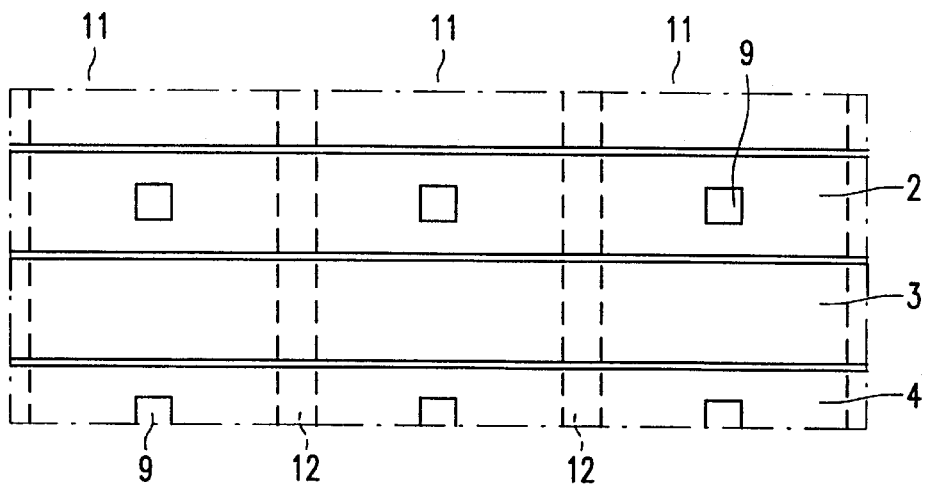
FIG. 11 is a plan view of a yet further embodiment of a charge coupled device according to the invention.

FIG. 11 is a plan view of an embodiment in which the poly electrodes 2, 3, 4 cover the entire surface area and are not provided with light-transmitting windows 13 as in the preceding examples. The openings 9 in such an embodiment may be provided above the channels 11 as indicated in FIG. 11, but they may alternatively be formed above the channel bounding zones 12. If a second nitride layer 18 is used, this layer may again be removed from above the electrodes 2, 4 in the first poly layer by one of the methods described with reference to FIG. 9.

It will be apparent that the invention is not limited to the embodiments described here, but that many more variations are possible to those skilled in the art within the scope of the invention. Thus the invention may also be applied to embodiments having more than two poly layers.

The invention may also be used to advantage in other types of charge coupled devices besides the ones described here, for example, in sensors of the interline type.

What is claimed is:

1. A charge coupled device with a semiconductor body which is provided at a surface with a system of electrodes to which voltages can be applied for controlling a storage and transport of electric charges in the semiconductor body, wherein said electrodes comprise layers of polysilicon covered by an oxide layer and are separated from the surface at least locally by a dielectric layer comprising a dual layer of silicon oxide and silicon nitride, the silicon nitride being locally provided with openings, characterized in that the openings in the silicon nitride layer are bounded by edges which, transverse to the surface, lie at a distance from the oxide layer covering the edges of said electrodes, in that the device comprises a plurality of parallel charge transport channels which form a matrix in which charge packets can be stored in a bidimensional pattern and can be transported in parallel to read-out means, in that the device forms a charge coupled imaging device, in that the system of electrodes forms electrode openings, referred to as windows, which transmit electromagnetic radiation, within which the surface is not covered by material of the electrodes, and which are situated between mutually-adjoining one of said parallel charge transport channels, in that the openings in the silicon nitride layer are formed at the areas of said windows, the edges of the openings lying at a distance from the edges of the windows, and in that the distance between the edges of the openings in the silicon nitride layer and the edges of the windows is chosen to be equal to or greater than 1.0 $\mu$m.

2. A charge coupled device as claimed in claim 1, characterized in that said mutually adjoining parallel charge transport channels in the semiconductor body are separated substantially only by a channel bounding region, the openings in the silicon nitride layer being situated above the channel bounding region.

3. A charge coupled device as claimed in claim 1, characterized in that selected openings in the silicon nitride layer are provided between the surface of the semiconductor body and electrodes which extend over the selected openings.

4. A charge coupled device with a semiconductor body which is provided at a surface with a system of electrodes to which voltages can be applied for controlling a storage and transport of electric charges in the semiconductor body, wherein said electrodes comprise layers of polysilicon covered by an oxide layer and are separated from the surface at least locally by a dielectric layer comprising a dual layer of silicon oxide and silicon nitride, the silicon nitride being locally provided with openings, characterized in that the openings in the silicon nitride layer are bounded by edges which, transverse to the surface, lie at a distance from the oxide layer covering the edges of said electrodes, in that the device comprises a plurality of parallel charge transport channels which form a matrix in which charge packets can be stored in a bidimensional pattern and can be transported in parallel to read-out means, in that the device forms a charge coupled imaging device, in that the system of electrodes forms electrode openings, referred to as windows, which transmit electromagnetic radiation, within which the surface is not covered by material of the electrodes, and which are situated between mutually-adjoining one of said parallel charge transport channels, in that the openings in the silicon nitride layer are formed at the areas of said windows, the edges of the openings lying at a distance from the edges of the windows, and in that said mutually-adjoining parallel charge transport channels in the semiconductor body are separated substantially only by a channel bounding region, the openings in the silicon nitride layer being situated above the channel bounding region.

5. A charge coupled device as claimed in claim 4, characterized in that selected openings in the silicon nitride layer are provided between the surface of the semiconductor body and electrodes which extend over the selected openings.

6. A charge coupled device as claimed in claim 5, characterized in that the surface is covered by portions of the silicon nitride layer at the areas of the windows.

7. A charge coupled device as claimed in claim 5, characterized in that the electrodes are formed in two silicon layers and are electrically insulated from one another, said electrodes formed in a first silicon layer being insulated from the surface of the semiconductor body by said dual layer of silicon oxide and silicon nitride, while said openings are present in the silicon nitride layer adjacent said electrodes which are formed in a second silicon layer.

8. A charge coupled device with a semiconductor body which is provided at a surface with a system of electrodes to which voltages can be applied for controlling a storage and transport of electric charges in the semiconductor body, wherein said electrodes comprise layers of polysilicon covered by an oxide layer and are separated from the surface at least locally by a dielectric layer comprising a dual layer of silicon oxide and silicon nitride, the silicon nitride being locally provided with openings, characterized in that the openings in the silicon nitride layer are bounded by hedges which, transverse to the surface, lie at a distance from the oxide layer covering the edges of said electrodes, in that the device comprises a plurality of parallel charge transport channels which form a matrix in which charge packets can be stored in a bidimensional pattern and can be transported in parallel to read-out means, in that the device forms a charge coupled imaging device, in that selected openings in the silicon nitride layer are provided between the surface of the semiconductor body and electrodes which extend over the selected openings, in that the electrodes are formed in two silicon layers and are electrically insulated from one another, said electrodes formed in a first silicon layer being insulated from the surface of the semiconductor body by said dual layer of silicon oxide and silicon nitride, and said openings are present in the silicon nitride layer adjacent said electrodes which are formed in a second silicon layer, and in that said selected openings in the silicon nitride layer have edges which lie at a distance equal to or greater than $1.0\,\mu m$ from the edges of the electrodes provided above the openings.

9. A charge coupled device as claimed in claim 8, characterized in that the electrodes are formed in two silicon layers which are electrically insulated from one another, the openings in the silicon nitride layer being formed adjacent the electrodes made from the silicon layer which was provided as the first silicon layer.

10. A charge coupled device as claimed in claim 8, characterized in that the electrodes are formed from two layers of silicon, said electrodes formed from a first silicon layer being separated from the surface by said first layer of silicon nitride provided with said openings, and said electrodes formed from a second layer of silicon being insulated from the electrodes of the first layer of silicon by a second silicon nitride layer which is also provided with said openings.

* * * * *